(12) United States Patent
Wang et al.

(10) Patent No.: US 6,918,959 B2
(45) Date of Patent: Jul. 19, 2005

(54) SEMICONDUCTING OXIDE NANOSTRUCTURES

(75) Inventors: Zhong L. Wang, Norcross, GA (US);
Zhengwei Pan, Atlanta, GA (US);
Zurong Dai, Marietta, GA (US)

(73) Assignee: Georgia Tech Research Corp, Atlanta, GA (US)

( * ) Notice: Subject to any disclaimer, the term of this patent is extended or adjusted under 35 U.S.C. 154(b) by 203 days.

(21) Appl. No.: 10/211,696

(22) Filed: Aug. 2, 2002

(65) Prior Publication Data

US 2004/0163584 A1 Aug. 26, 2004

Related U.S. Application Data

(62) Division of application No. 10/042,868, filed on Jan. 8, 2000, now Pat. No. 6,586,093.
(60) Provisional application No. 60/261,367, filed on Jan. 12, 2001.

(51) Int. Cl.[7] .............................................. C30B 25/00
(52) U.S. Cl. ....................................... 117/68; 438/497
(58) Field of Search ............................ 117/68; 438/497

(56) References Cited

U.S. PATENT DOCUMENTS

| | | | |
|---|---|---|---|
| 6,017,390 A | 1/2000 | Charych et al. | ............... 117/68 |
| 6,225,198 B1 | 5/2001 | Alivisatos et al. | .......... 438/497 |
| 6,306,736 B1 | 10/2001 | Alivisatos et al. | .......... 438/497 |

OTHER PUBLICATIONS

Dai, Pan and Wang; Gallium Oxide Nanoribbons and Nanosheets; pp. 1–14.
Pan, Dai and Wang; Lead Oxide Nanobelts and Phase Transformation Induced by Electron Beam Irradiation, Aug., 2001; pp. 1–13.
Pan, Dai and Wang; Nanobelts of Semiconducting Oxides; Mar. 9, 2001; pp. 1947–1949
Ginley and Bright; Transparent Conducting Oxides; Aug., 2000; pp. 15–18.
Coutts, Young and Li; Characterization of Transparent Conducint Oxides; Aug., 2000; pp. 58–65.
Lewis and Paine; Applications and Processing of Transparent Conducting Oxides; Aug., 2000; pp. 22–26.
Gordon; Criteria for Choosing Transparent Conductors; Aug., 2000; pp. 52–57.
Kawazoe, Yanagi; Ueda, and Hosono; Transparent p–Type Conducting Oxides; Design and Fabrication of p–n Heterojunctions; Aug. 2000, pp. 28–35.
Minami; New n–Type Transparent Conducting Oxides; Aug. 2000; pp. 38–43.
Wang; Semiconducting Oxides Prepared in the Form of Nanobelts; Aug., 2001, pp. 603–604.

*Primary Examiner*—Felisa Hiteshew
(74) *Attorney, Agent, or Firm*—Thomas, Kayden, Horstemeyer & Risley, LLP

(57) ABSTRACT

Nanostructures and methods of fabricating nanostructures are disclosed. A representative nanostructure includes a substrate having at least one semiconductor oxide. In addition, the nanostructure has a substantially rectangular cross-section. A method of preparing a plurality of semiconductor oxide nanostructures that have a substantially rectangular cross-section from an oxide powder is disclosed. A representative method includes: heating the oxide powder to an evaporation temperature of the oxide powder for about 1 hour to about 3 hours at about 200 torr to about 400 torr in an atmosphere comprising argon; evaporating the oxide powder; and forming the plurality of semiconductor oxide nanostructures.

6 Claims, 3 Drawing Sheets

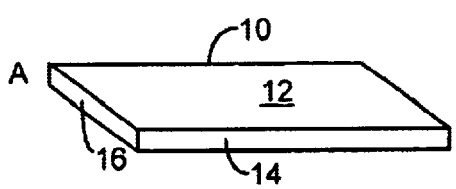
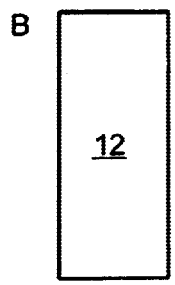
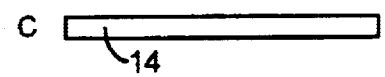
FIG. 1A  FIG. 1B  FIG. 1C
FIG. 1D
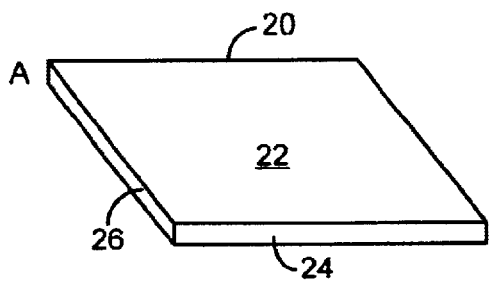
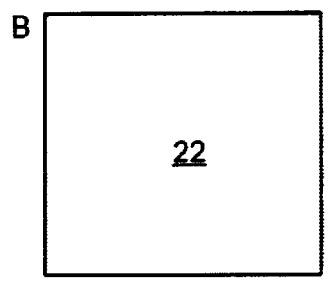
FIG. 2A  FIG. 2B
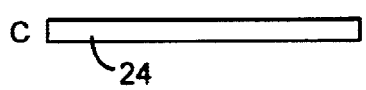
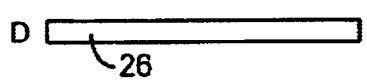
FIG. 2C  FIG. 2D

SEMICONDUCTING OXIDE NANOSTRUCTURES

CROSS-REFERENCE TO RELATED APPLICATION

This application is a divisional application of the patent application having Ser. No. 10/042,868 filed on Jan. 8, 2000 now U.S. Pat. No. 6,586,093.

This application claims priority to copending U.S. provisional application entitled, "Semiconductive Oxide Nanobelts," having Ser. No. 60/261,367, filed Jan. 12, 2001, which is entirely incorporated herein by reference.

TECHNICAL FIELD

The present invention is generally related to nanostructures and, more particularly is related to semiconductive oxide nanostructures and fabrication thereof.

BACKGROUND

Binary semiconducting oxides often have distinctive properties and can be used as transparent conducting oxide (TCO) materials and gas sensors. Current studies of semiconducting oxides have been focused on two-dimensional films and zero-dimensional nanoparticles. For example, fluorine-doped tin oxide films are used in architectural glass applications because of their low emissivity for thermal infrared heat. Tin-doped indium oxide (ITO) films can be used for flat panel displays (FPDs) due to their high electrical conductivity and high optical transparency; and zinc oxide can be used as an alternative material for ITO because of its lower cost and easier etchability. Tin oxide nanoparticles can be used as sensor materials for detecting leakage of several inflammable gases owing to their high sensitivity to low gas concentrations.

In contrast, investigations of wire-like semiconducting oxide nanostructures can be difficult due to the unavailability of nanowire structures. Wire-like nanostructures have attracted extensive interest over the past decade due to their great potential for addressing some basic issues about dimensionality and space confined transport phenomena as well as related applications. In geometrical structures, these nanostructures can be classified into two main groups: hollow nanotubes and solid nanowires, which have a common characteristic of cylindrical symmetric cross-sections. Besides nanotubes, many other wire-like nanomaterials, such as carbides, nitrides, compound semiconductors, element semiconductors, and oxide nanowires have been successfully fabricated.

However, the nanostructures discussed above can have a variety of deficiencies. For example, often it is difficult to control the structure and morphology of many nanostructures. Further, many nanostructures are not defect and/or dislocation free. These deficiencies can cause problems such as, for example, uncontrolled properties due to uncontrolled structure and/or morphology, scattering from dislocations in electric transport applications, and degraded optical properties. Thus, a heretofore unaddressed need exists in the industry to address at least the aforementioned deficiencies and/or inadequacies.

SUMMARY OF THE INVENTION

Briefly described, the present invention provides for new types of nanostructures. A representative nanostructure includes a substrate having at least one semiconductor oxide. In addition, the nanostructure has a substantially rectangular cross-section.

The present invention also involves a method of preparing a plurality of semiconductor oxide nanostructures that have a substantially rectangular cross-section from an oxide powder. A representative method includes: heating the oxide powder to an evaporation temperature of the oxide powder for about 1 hour to about 2 hours at about 200 torr to about 400 torr in an atmosphere comprising argon; evaporating the oxide powder; and forming the plurality of semiconductor oxide nanostructures.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIGS. 1A through 1D are schematics that illustrate a perspective view, a top view, a side view, and, an end view of a nanobelt, respectively.

FIGS. 2A through 2D are schematics that illustrate a perspective view, a top view, a side view, and, an end view of a nanosheet, respectively.

DETAILED DESCRIPTION

Figure 3:
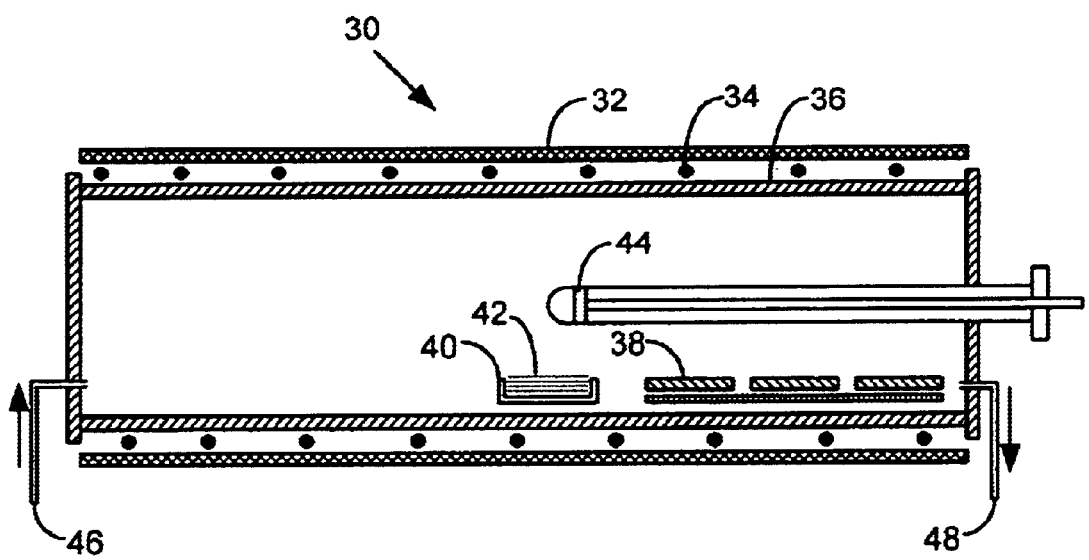
FIG. 3 is a schematic that illustrates an apparatus that can be used to fabricate the nanobelt and/or the nanosheet shown in FIGS. 1 and 2.

The present invention provides for nanostructures and methods of fabrication thereof. The nanostructures have substantially rectangular cross-sections that may be defect free, dislocation free, and/or structurally uniform. In addition, the nanostructure can be structurally controlled as well as morphology controlled, while the surfaces of the nanostructure are specific crystallographic planes. In this manner, the nanostructures may overcome some of the deficiencies described above.

In general, the nanostructures can be nanobelts, nanosheets, or nanodiskettes that have a substantially rectangular cross-section. FIGS. 1A through 1D illustrate a perspective view (A), a top view (B), a side view (C), and an end view (D) of a nanobelt 10, respectively. The perspective view (A) illustrates a top 12, a side 14, and an end 16 of the nanobelt 10. The top view (B), side view (C), and the end view (D) illustrate the top 12, the side 14, and the end 16 of the nanobelt 10. FIGS. 2A through 2D illustrate a perspective view (A), a top view (B), a side view (C), and an end view (D) of a nanosheet 20, respectively. The perspective view (A) illustrates a top 22, a side 24, and an end 26 of the nanosheet 20. The top view (B), the side view (C), and the end view (D) illustrate the top 22, the side 24, and the end 26 of the nanosheet 20.

Nanobelts 10 can be characterized as "ribbon-like" structures, while the nanosheets 20 can take the form of a variety of polygonal shapes such as, for example, a rectangle, a square, a triangle, etc. Nanodiskettes (not shown) are similar to nanosheets 20 except that nanodiskettes are "coin-shaped" structures. This disclosure does not describe in any definite dimensions the difference between nanobelts 10, nanosheets 20, and nanodiskettes. For clarity, this disclosure refers to nanobelts 10, nanosheets 20, and nanodiskettes as "nanostructures."

The nanostructures are fabricated of at least one semiconductor oxide and/or at least one doped semiconductor oxide. The semiconductor oxide includes oxides of zinc, cadmium, mercury, gallium, indium, tellurium, germanium, tin, and lead. The nanostructure fabricated of at least one semiconductive oxide can be, for example, a binary or a ternary complex of the semiconductor oxide.

The doped semiconductor oxide includes at least one semiconductive oxide that can be doped with at least one dopant that may be chosen from aluminum, gallium, boron, yttrium, indium, scandium, silicon, germanium, titanium, zirconium, hafnium, antimony, tin, nitrogen, and fluorine. The nanostructure can be fabricated of at least one doped semiconductor oxide, for example, a binary or a ternary complex of the doped semiconductor oxide.

The size (e.g. length, width, and height) of the nanostructure can vary within a type of semiconductor oxide and among each of the semiconductor oxides. The size of the nanostructure can be controlled to fit certain criteria for a particular application. However, in general, the nanostructures can be about 20 nanometers to about 6000 nanometers in width, about 5 nanometers to about 100 nanometers in height, and about 100 nanometers to about 3 millimeters in length. The nanostructures can have a width-to-height ratio of about 5 to about 15. In addition to the dimensions described above, the following examples describe illustrative sizes of the nanostructures for some of the semiconductor oxides.

The methods for fabricating nanostructures can be based on thermal evaporation of oxide powders under controlled conditions that can be performed on the apparatus 30 shown in FIG. 3. The apparatus 30 includes a horizontal tube furnace 32 that has an alumina tube 36 therein and is wrapped in a heating coil 34. Inside the alumina tube 36 are one or more alumina plates 38 and an alumina crucible 40, which contains the oxide powder 42 and/or other chemicals used to fabricate the nanostructures. To measure the temperature at various locations in the furnace 32, a thermocouple 44 or other temperature measuring device can be moved within the furnace 32. The apparatus 30 is also equipped with input 46 and output tubes 48 to introduce and pump-out a flow gas such as Argon (Ar). Additional features known by one skilled in the art are also included in the apparatus such as vacuum pumps, vacuum manifolds, reactant gas inputs, reactant gas manifolds, etc., and will not be discussed here.

In practice, the desired oxide powder is placed in the aluminum crucible 40 in the center of an alumina tube 36. The temperature, pressure, and evaporation time ate controlled. Typically, the evaporation is performed without a catalyst. Except for the evaporation temperature that can be determined based on the melting point of the oxides used, the following parameters are typically kept constant: evaporation time (e.g., 2 hours), alumina tube 36 pressure (e.g., 300 Torr), and flow gas flow rate (e.g., Argon flowed at approximately 50 standard cubic centimeter per minute (sccm)). During evaporation the products of the evaporation are deposited onto the alumina plates 38 located at the downstream end of the alumina tube 36.

Typically, the as-deposited products can be characterized and analyzed by x-ray diffraction (XRD) (Philips PW 1800 with Cu K$\alpha$ radiation), scanning electron microscopy (SEM) (Hitachi S800 FEG), transmission electron microscopy (TEM) (Hitachi HF-2000 FEG at 200 kV and JEOL 4000EX high resolution TEM (HRTEM) at 400 kV), and energy dispersive x-ray spectroscopy (EDS).

Figure 4:
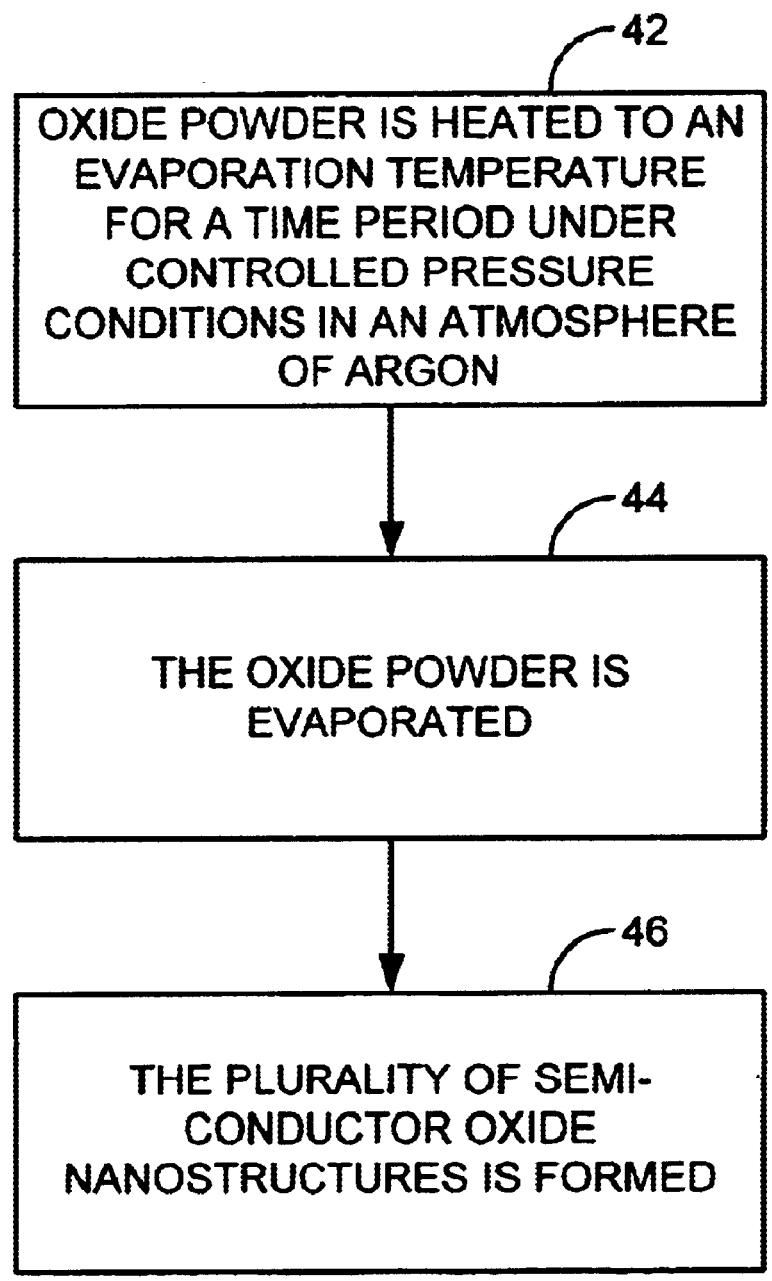
FIG. 4 is a flow diagram illustrating a representative method for fabricating nanostructures as shown in FIGS. 1 and 2.

Reference will now be made to the flow diagram of FIG. 4. FIG. 4 illustrates a representative method of preparing a plurality of semiconductor oxide nanostructures having a substantially rectangular cross-section from an oxide powder. Initially, the oxide powder is heated to an evaporation temperature of the oxide powder for about 1 hour to about 3 hours at about 200 torr to about 400 torr in an atmosphere comprising Argon, as shown in block 42. Then, the oxide powder is evaporated, as shown in block 44. Thereafter, the plurality of semiconductor oxide nanostructures is formed, as shown in block 46.

Having summarized the nanostructures and methods of fabrication thereof above, reference will now be made in detail to six illustrative examples of the semiconductor oxide nanostructures. While the invention is described in connection with these examples, there is no intent to limit the invention to the following examples. On the contrary, the intent is to cover all alternatives, modifications, and equivalents included within the spirit and scope of the invention.

Examples 1–4 are discussed in the paper entitled "Nanobelts of Semiconducting Oxides," published in *Science* Vol. 291, 9, March 2001, which is herein incorporated by reference. Example 5 is discussed in the paper entitled "Gallium Oxide Nanoribbons and Nanosheets," and is in-press at the *Journal of Physical Chemistry B*, which is herein incorporated by reference. Example 6 is discussed in the paper entitled "Lead Oxide Nanobelts and Phase Transformation Induced by Electron Beam Irradiation," and is in-press at *Applied Physics Letters*, which is herein incorporated by reference.

EXAMPLE 1

Zinc Oxide

Thermal evaporation of zinc oxide (ZnO) powders (purity: 99.99%, melting point: 1975° C.) at 1400° C. for approximately 2 hours resulted in white wool-like products that formed in high yield on the surface of the alumina plate 38. Scanning electron microscopy (SEM) observations reveal that the products consist of a large quantity of nanostructures with typical lengths in the range of several tens to several hundreds of micrometers, while some of nanostructures have lengths on the order of millimeters. EDS microanalysis and powder XRD measurement show that the sample is wurtzite (hexagonal) structured ZnO with lattice constants of a=3.249 Å and c=5.206 Å, consistent with the standard values for bulk ZnO.

TEM images reveal that the ZnO nanostructure has a substantially rectangular cross-section (i.e., nanobelt) that is distinct in cross-section from nanotubes and nanowires. Each nanobelt has a uniform width along a substantial portion of the length of the nanobelt, and the typical widths of the nanobelts are in the range of 50 to 300 nanometers. In addition, the ends of the nanobelts do not include a particle. The typical height and width-to-height ratios of the ZnO nanobelts are in the range of 10 to 30 nanometers and about 5 to about 10, respectively. HRTEM and electron diffraction show that the ZnO nanobelts are structurally uniform and single crystalline but with two different growth directions.

The nanobelt, growing along [0001] and enclosed by $\pm(2\bar{1}\bar{1}0)$ and $\pm(01\bar{1}0)$ facets, shows no defect and dislocations. The nanobelt, growing along [$01\bar{1}0$] and enclosed by $\pm(0001)$ and $\pm(2\bar{1}\bar{1}0)$ facets, is also dislocation free but with only a single stacking fault that is parallel to the axis and runs throughout the entire length of the nanobelt. The surfaces of these nanobelts are clean, atomically sharp, and without any sheathed amorphous phase.

EXAMPLE 2

Tin Oxide

Single crystalline $SnO_2$ nanobelts of rutile structure can be fabricated by thermal evaporation of either $SnO_2$ powders (purity: 99.9%, melting point: 1630° C.) at 1350° C. and/or SnO powders (purity: 99.9%, melting point: 1080° C.) at 1000° C. After evaporation, white fuzz-like products are deposited on the alumina plate 38, whether the source material was $SnO_2$ or SnO. SEM imaging and EDS analysis show that the products are composed of large quantities of $SnO_2$ nanobelts (with lengths up to the order of millimeters) and a small fraction of Sn nanoparticles. XRD patterns from the synthesized $SnO_2$ nanobelt samples prove the rutile type structure with lattice constants of a=4.772 Å and c=3.184 Å, which are consistent with those of bulk $SnO_2$. TEM images display the characteristic shape (e.g. rectangular cross-section) of the $SnO_2$ nanobelts. Each nanobelt is uniform in width and height, and the typical widths of the $SnO_2$ nanobelts are in the range of about 50 to about 200 nanometers. Cross-sectional TEM observations show that the cross-sections of the $SnO_2$ nanobelts are substantially rectangular, with typical width-to-height ratios of about 5 to about 10. High-resolution TEM images reveal that the nanobelts are single crystalline and dislocation free. Electron diffraction pattern indicates that the $SnO_2$ nanobelt grows along [101], and it is enclosed by $\pm(010)$ and $\pm(10\bar{1})$ crystallographic surfaces.

EXAMPLE 3

Indium Oxide

Thermal evaporation of indium oxide ($In_2O_3$) powders (purity: 99.99%, melting point: ~1920° C.) at 1400° C. yields $In_2O_3$ nanobelts. TEM observations show that most of the $In_2O_3$ nanobelts have uniform width and height along their lengths. However, some nanobelts exhibit a sharp shrinkage in width while the height is preserved and form a bridge-like structure, which may be used to measure transport from an oxide nanobridge. Typically, the $In_2O_3$ nanobelts have widths in the range of about 50 to about 150 nanometers and lengths of several tens to several hundreds of micrometers. Electron diffraction analysis shows that the $In_2O_3$ nanobelts are single crystalline, and grow along [001], the surfaces being enclosed by (100) and (010) surfaces.

EXAMPLE 4

Cadmium Oxide

Nanobelts of cadmium oxide (CdO) with sodium chloride (NaCl) cubic structure can be fabricated by evaporating (CdO) powders (purity: 99.998%, melting point: 1430° C.) at 1000° C. Besides CdO nanobelts, many single crystalline CdO sheets with sizes on the order of several to several tens of micrometers are also formed. These CdO sheets usually have shapes such as rectangles, triangles, and parallelograms. The lengths of the CdO nanobelts are usually less than about 100 micrometers, and their widths are typically about 100 to about 500 nanometers, significantly wider and shorter than those of ZnO, $SnO_2$ and $In_2O_3$ nanobelts, respectively. As a result, the width-to-height ratios of CdO nanobelts are usually greater than 10. Electron diffraction pattern shows that the nanobelts grow along [100], and their surfaces are enclosed by $\pm(001)$ and $\pm(010)$ facets. In addition, some nanobelts were broken into two halves during TEM observation due to electron beam illumination, which is likely to be caused by the easy cracking characteristic of the NaCl-type ionic structure of the nanobelt. Thus, it may be possible to cut these nanobelts with a focused electron or ion beam, so that nanobelts with specific lengths for nano-device applications could be fabricated.

EXAMPLE 5

Gallium Oxide

The synthesis of gallium oxide ($Ga_2O_3$) is based on thermal evaporation of gallium nitride (GaN) powders under controlled conditions in the presence of oxygen. The commercially supplied GaN powders (99.99% metals basis) are placed at the center of an alumina tube 36. The furnace is heated at a rate of about 10–15° C./min to about 1100° C., and then maintained at this temperature for 2 hours being cooled down to room temperature. The pressure in the alumina tube 36 is about 300 Torr, and the Ar flow rate is about 50 sccm. During evaporation, the products are deposited onto alumina plates 38, where the temperature is about 800–850° C. The as-deposited products are wool-like with a light gray color.

SEM analysis reveals that the products consist of a large quantity of nanostructures with typical lengths in the range of several tens to several hundreds of micrometers, while some of the nanostructures have lengths on the order of millimeters. The as-synthesized sample also contains a large fraction of nanosheets, and size of the nanosheets is about 10 micrometers across and several tens of nanometers in height. The nanosheets have straight edges with sharp corners, suggesting that they terminate by faceted crystallographic planes. Chemical microanalysis using EDS shows that the nanostructures obtained are $Ga_2O_3$. The formation of $Ga_2O_3$ rather than GaN is believed due to the high combinability of Ga with oxygen, which is believed to leak into the furnace.

The width of the nanobelts varies from about 40 to about 300 nanometers, and the geometry of the nanobelts is substantially uniform. The height of the nanobelts is about 10 to about 60 nanometers depending on the width. The nanobelts ate single crystalline and free from dislocations. Their surfaces are clean without an amorphous layer.

$Ga_2O_3$ is of polymorphism in its crystal structure. The polymorph of $Ga_2O_3$ mainly includes $\alpha$-(R$\bar{3}$, a=4.979 Å and c=13.429 Å), $\beta$-(C2.'m, a=12.23 Å, b=3.04 Å, c=5.80 Å, and $\beta$=103.7 Å) and $\gamma$-$Ga_2O_3$ (Fd$\bar{3}$m, a=8.22 Å). Of those phases, the $\beta$-$Ga_2O_3$ is only stable modification. Some of the nanobelts are enclosed by $\pm(100)$ top and bottom surfaces and $\pm(10\bar{1})$ side surfaces, while other nanobelts can be enclosed by $\pm(201)$ top and bottom surfaces and $\pm(010)$ side surfaces. It has been found that both the $\pm(010)$ and the $\pm(10\bar{1})$ crystal planes can serve as the growth front of nanobelts with growth directions of [010] and [001], respectively. The growth front of the nanoribbon is $\pm(010)$ and the corresponding HRTEM image indicates a perfect crystallinity of the $Ga_2O_3$ nanobelt.

Nanosheets have some straight edges with corners of specific angles, typically of 45° and 90°. Some of the nanosheets are directly connected to nanobelts, indicating that—they have the same structure. Electron diffraction shows that the nanosheets have the same crystal structure of β-Ga$_2$O$_3$ as that of nanobelts. The electron diffraction pattern demonstrates the corresponding [101] crystal zone of β-Ga$_2$O$_3$. The two perpendicular planes result in the rectangular- and L-shape structures. Beside the ±(010) and the ±(10$\bar{1}$) facets, a third-type of plane with about a 45° angle with respect to the two sides is also observed. This type of plane is identified to be the (21$\bar{2}$) plane from the electron diffraction pattern. The top and bottom surfaces are also the ±(100) crystal planes of β-Ga$_2$O$_3$. Based on our SEM observation, the height of the nanobelts and nanosheets are about 20–60 nanometers.

The growth morphology of G$_2$O$_3$ nanobelts and nanosheets is distinctively different from that of Ga$_2$O$_3$ nanorods and nanowires. The nanorods grown by thermal evaporation of a mixture of GaN, graphite and Ni particles have diameters of 5–10 nanobelts and growth directions of either [111] or [200]. The nanowires grown by an arc-discharge of GaN with the presence of Co and Ni particles have diameters of 20–30 nanobelts and a growth direction of [001]. The formation of nanobelts and nanosheets is a combined result of vapor-liquid-solid (VLS) and solid-solid (SS) growth kinetics.

EXAMPLE 6

Thermal evaporation of lead oxide (PbO) powders (purity: 99.99%) at about 950° C. yields PbO nanobelts. The thermal evaporation is conducted at 950° C. for 1 hour under a pressure of 300 Torr and Ar flowing at a flow rate of 50 sccm. The products deposited on the surface of the alumina plate 38 substrates are characterized by SEM, TEM, and EDS.

The as-synthesized products display a dark gray color that is distinctive from the yellow colored PbO source powders. SEM observations reveal that the products consist of a large quantity of belt-like nanostructures and faceted particles with diameters in the range of about 0.1 to about 2 micrometers. Chemical analysis by EDS indicates that the nanostructures are PbO$_2$ and the particles are metal Pb covered with a thin oxide layer.

TEM images show the morphology to be consistent with nanobelt morphology. The PbO$_2$ nanobelts are several tens to several hundreds of micrometers in length. Each nanobelt has a uniform width over its entire length, and the typical width of the nanobelts in the range of about 50 to about 300 nanometers. The height of the nanobelts varies with its width, and typically is in the range of about 10 to about 30 nanometers, as estimated by TEM observations. The width-to-height ratio of the nanobelts is about 5 to about 10.

It is noted that each nanobelt is connected with a Pb particle at its growth front, implying that the Pb tip likely acts as a catalyst in growth of the nanobelt. The diameter of the Pb tips is several times bigger than the width of connecting nanobelts. The Pb tips have the faceted geometrical shape of an octagonal projection, which indicates that Pb tips are crystalline and likely adopt the shape of truncated octahedron enclosed by (100) and (111) crystal planes because of lower surface energies.

PbO$_2$ can form two possible crystal structures (α and β) of orthorhombic and tetragonal lattice, respectively. Electron diffraction analysis and high resolution TEM imaging indicate that the as-synthesized PbO$_2$ nanobelt is single crystalline structure without dislocation and has a tetragonal structure (P4/mnm, a=4.961 Å and c=3.385 Å), i.e. β-PbO$_2$ nanobelts are formed. The nanobelt is enclosed by top surfaces ±(201) and side surfaces ±(10$\bar{1}$). The growth direction of the nanobelt is parallel to [010] with growth front (010).

The growth characteristics of the PbO$_2$ nanobelts is quite different from that of ZnO, SnO$_2$, In$_2$O$_3$, CdO and Ga$_2$O$_3$ nanobelts, in which no particle was found at the growth fronts of the nanobelts. This implies that a different growth mechanism be employed by the PbO$_2$ nanobelts. The growth of the former five oxide nanobelts may be governed by a vapor-liquid process. As to the PbO$_2$ nanobelts described here, however, the growth is likely to be controlled by vapor-liquid-solid process, which has been suggested for the nanowires grown by a catalytic-assisted technique, in which a metal particle is definitely located at the growth front of the wire and acts as the catalytic active site.

The dominant orientation relationship between the PbO$_2$ and the PbO is determined to be (010)$_2$∥(100)$_1$ and [101]$_2$∥ [001]$_1$. Another preferable orientation of the PbO phase precipitation is 45° relative to the former case.

The PbO$_2$ nanobelts have been determined to be enclosed by top surfaces ±(201) and side surfaces ±(10$\bar{1}$). The growth direction of the nanobelts is parallel to [010], along with a typical length of several hundred micrometers, width of 50 to 300 nanometers and width-to-height ratio of 5 to 10. Each PbO$_2$ nanobelt is found to have a large polyhedral Pb tip at its growth front, suggesting that the growth of the PbO$_2$ nanobelts is likely controlled by a vapor-liquid-solid mechanism. The PbO$_2$ nanobelts and the crystalline Pb tips are very sensitive to electron beam irradiation, resulting in the phase transformation from PbO$_2$ to PbO, melting of the Pb tips and formation of Pb nanocrystals under a high vacuum condition.

It should be emphasized that the above-described embodiments of the present invention, particularly, any embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A method of preparing a plurality of semiconductor oxide nanostructures from an oxide powder, each of the plurality of semiconductor oxide nanostructures having a substantially rectangular cross-section, the method comprising:

heating the oxide powder to an evaporation temperature of the oxide powder for about 1 hour to about 3 hours at about 200 torr to about 400 torr in an atmosphere comprising argon;

evaporating the oxide powder; and forming the plurality of semiconductor oxide nanostructures.

2. The method of claim 1, wherein forming the plurality of semiconductor oxide nanostructures comprises:

forming the plurality of semiconductor oxide nanostructures, wherein the plurality of semiconductor oxide nanostructures includes at least one semiconductor oxide that is chosen from oxides of zinc, cadmium, mercury, gallium, indium, tellurium, germanium, tin, and lead.

3. The method of claim 1, wherein forming the plurality of semiconductor oxide nanostructures comprises:

forming the plurality of semiconductor oxide nanostructures, wherein the at least one semiconductor oxide is a doped semiconductor oxide, wherein the doped semiconductor oxide includes the semiconductor oxide and at least one dopant, wherein the at least one dopant is chosen from aluminum, gallium, boron, yttrium, indium, scandium, silicon, germanium, titanium, zirconium, hafnium, antimony, tin, nitrogen, and fluorine.

4. A method of preparing a nanostructure, comprising the steps of:

providing an oxide powder selected from an oxide of a metal is chosen from zinc, cadmium, mercury, gallium, indium, tellurium, germanium, tin, and lead;

heating the oxide powder to an evaporation temperature of the oxide powder for about 1 hour to about 3 hours at about 200 torr to about 400 torr in an atmosphere comprising an inert gas;

evaporating the oxide powder while flowing an inert gas over the oxide powder; and forming a plurality of free standing semiconductor oxide nanostructures, wherein each of the plurality of semiconductor oxide nanostructures having a substantially rectangular cross-section, and wherein the nanostructure is within the range of: about 20 nanometers to about 6000 nanometers in width, about 5 nanometers to about 100 nanometers in height, and about 100 nanometers to about 3 millimeters in length.

5. The method of claim 4, wherein forming the plurality of semiconductor oxide nanostructures comprises:

forming the plurality of free standing semiconductor oxide nanostructures, wherein the plurality of semiconductor oxide nanostructures includes at least one semiconductor oxide that is chosen from oxides of zinc, cadmium, mercury, gallium, indium, tellurium, germanium, tin, and lead.

6. The method of claim 4, wherein forming the plurality of semiconductor oxide nanostructures comprises:

forming the plurality of free standing semiconductor oxide nanostructures, wherein the at least one semiconductor oxide is a doped semiconductor oxide, wherein the doped semiconductor oxide includes the semiconductor oxide and at least one dopant, wherein the at least one dopant is chosen from aluminum, gallium, boron, yttrium, indium, scandium, silicon, germanium, titanium, zirconium, hafnium, antimony, tin, nitrogen, and fluorine.

* * * * *

UNITED STATES PATENT AND TRADEMARK OFFICE
CERTIFICATE OF CORRECTION

PATENT NO.  : 6,918,959 B2
DATED       : July 19, 2005
INVENTOR(S) : Wang et al.

It is certified that error appears in the above-identified patent and that said Letters Patent is hereby corrected as shown below:

Column 3,
Line 57, delete "ate" and replace with -- are --.

Column 5,
Line 55, delete "$In_2\ O_3$" and replace with -- $In_2O_3$ --.

Column 6,
Line 27, after "hours" insert -- before --.
Line 39, after "and" insert -- the --.
Line 51, delete "ate" and replace with -- are --.
Line 53, delete "of" and replace with -- a --.
Line 57, after "is" insert -- the --.

Column 7,
Line 2, delete "—".

Column 8,
Line 5, delete "is" and replace with -- are --.
Line 9, delete "be" and replace with -- is --.

Column 9,
Line 15, delete "is".
Line 25, delete "having" and replace with -- has --.

Signed and Sealed this

Twenty-seventh Day of September, 2005

JON W. DUDAS
*Director of the United States Patent and Trademark Office*